United States Patent
Kim et al.

(10) Patent No.: US 8,747,707 B2
(45) Date of Patent: Jun. 10, 2014

(54) PASTE FOR SOLAR CELL ELECTRODE AND SOLAR CELL USING THE SAME

(75) Inventors: Dong Jun Kim, Uiwang-si (KR); Jae Hwan Oh, Uiwang-si (KR); Seok Hyun Jung, Uiwang-si (KR); Byung Chul Lee, Uiwang-si (KR); Hee In Nam, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 262 days.

(21) Appl. No.: 12/947,459

(22) Filed: Nov. 16, 2010

(65) Prior Publication Data

US 2011/0147678 A1 Jun. 23, 2011

(30) Foreign Application Priority Data

Dec. 17, 2009 (KR) .................. 10-2009-0126390

(51) Int. Cl.
*H01B 1/02* (2006.01)
*H01B 1/22* (2006.01)
*H01B 1/12* (2006.01)
*H01L 25/00* (2006.01)
*H01L 31/00* (2006.01)
*H02N 6/00* (2006.01)

(52) U.S. Cl.
USPC ......... 252/519.3; 252/513; 252/514; 136/243

(58) Field of Classification Search
CPC ... H01B 1/22; H01L 31/022425; Y02E 10/50
USPC ............... 252/500, 513, 514, 519.3; 136/243
See application file for complete search history.

(56) References Cited

U.S. PATENT DOCUMENTS

| 4,567,059 A * | 1/1986 | Yamaoka et al. ............ 427/79 |
| 5,645,765 A | 7/1997 | Asada et al. |
| 2004/0245507 A1 | 12/2004 | Nagai et al. |
| 2006/0231804 A1 * | 10/2006 | Wang et al. .................. 252/500 |
| 2009/0104457 A1 | 4/2009 | Carroll et al. |
| 2009/0120490 A1 | 5/2009 | Huang et al. |
| 2009/0301553 A1 * | 12/2009 | Konno et al. ................ 136/252 |

FOREIGN PATENT DOCUMENTS

| CN | 1873836 | 12/2006 |
| EP | 1 713 091 A2 | 10/2006 |

* cited by examiner

*Primary Examiner* — Harold Pyon
*Assistant Examiner* — Tanisha Diggs
(74) *Attorney, Agent, or Firm* — Lee & Morse, P.C.

(57) ABSTRACT

A paste for solar cell electrodes includes conductive particles, a glass frit, an organic vehicle, and lead oxide. The lead oxide may be added in an amount of about 0.05 to about 1.5 wt % with respect to a total weight of the paste.

12 Claims, 1 Drawing Sheet

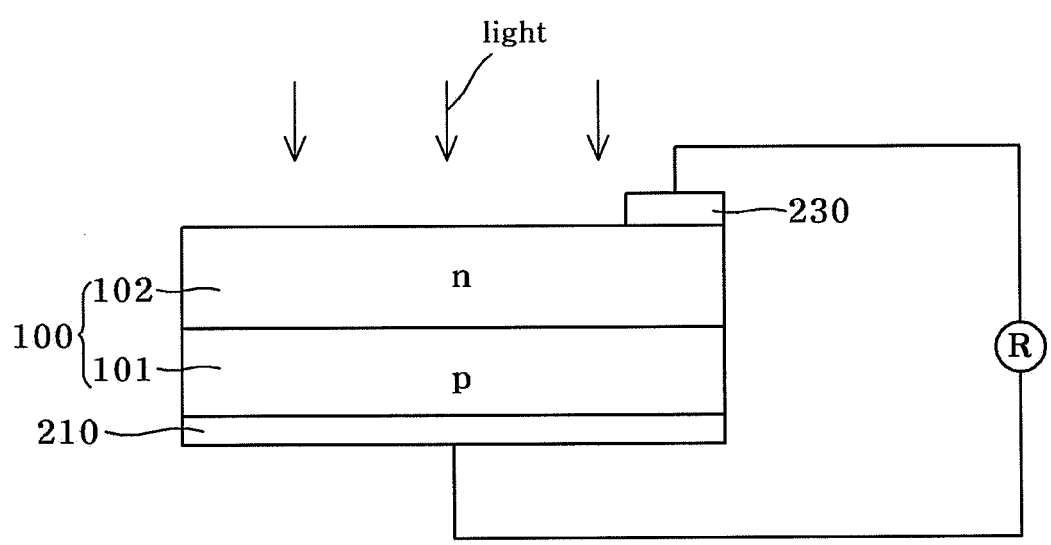

PASTE FOR SOLAR CELL ELECTRODE AND SOLAR CELL USING THE SAME

BACKGROUND

1. Field

Embodiments relate to a paste for a solar cell electrode and a solar cell using the same.

2. Description of the Related Art

As fossil fuels such as oil and coal are expected to be exhausted, solar cells utilizing sunlight as an alternative energy source have attracted attention. A solar cell may be formed to generate electric energy using the photovoltaic effect of a p-n junction which converts photons of sunlight into electricity. In the solar cell, a front electrode and a rear electrode may be formed on a front surface and a rear surface of a semiconductor wafer or a substrate with the p-n junction, respectively. Then, the photovoltaic effect of the p-n junction is induced by sunlight entering the wafer and electrons generated by the photovoltaic effect of the p-n junction provide an electric current flowing to the outside through the electrodes.

SUMMARY

An example embodiment is directed to a paste for solar cell electrodes, including conductive particles, a glass frit, an organic vehicle, and lead oxide. The lead oxide may be added in an amount of about 0.05 to about 1.5 wt % with respect to a total weight of the paste.

The conductive particles may include at least one of silver, gold, palladium, platinum, copper, chromium, cobalt, aluminum, tin, lead, zinc, iron, iridium, osmium, rhodium, tungsten, molybdenum, nickel, and indium tin oxide.

The glass frit may be a lead-free glass frit as defined herein.

The glass frit may be a bismuth-based glass frit.

The lead oxide may be added in an amount of about 0.1 to about 1 wt % with respect to the total weight of the paste.

The lead oxide may have an average particle diameter (D50) of about 0.1 to about 25 μm The paste may include about 60 to about 90 wt % of the conductive particles, about 0.5 to about 20 wt % of the glass frit, about 1 to about 30 wt % of the organic vehicle, and about 0.005 to about 1.5 wt % of the lead oxide.

The paste for solar cells may further include zinc oxide, bismuth oxide, or a mixture thereof, in an amount of about 1 to about 10 wt %.

The organic vehicle may include an organic binder and a solvent.

The organic vehicle may include about 5 to about 40 wt % of the organic binder and about 60 to about 95 wt % of the solvent.

Another example embodiment is directed to a solar cell electrode formed by firing a paste according to an embodiment, the solar cell electrode comprising conductive particles, a glass frit, and lead oxide.

Another example embodiment is directed to a solar cell including an electrode according to an embodiment.

BRIEF DESCRIPTION OF THE DRAWING

The above and other features and advantages will become more apparent to those of skill in the art by describing in detail example embodiments with reference to the attached drawing, in which:

FIG. 1 illustrates a view of a solar cell according to an embodiment.

DETAILED DESCRIPTION

Korean Patent Application No. 10-2009-0126390, filed on Dec. 17, 2009, in the Korean Intellectual Property Office, and entitled: "Paste for Solar Cell Electrode and Solar Cell Using the Same," is incorporated by reference herein in its entirety.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to an embodiment, lead oxide (PbO) may be added in an amount of about 0.05 to about 1.5% by weight to a paste for solar cell electrodes, the paste including conductive particles, a glass frit, and an organic vehicle. The paste for solar cells according to an embodiment may provide an improvement in contact resistance of an electrode made therewith, and may enhance efficiency of a solar cell including the electrode. The paste for solar cell electrodes may be used to form a front electrode of a solar cell facing an incident direction of sunlight and/or a rear electrode of the solar cell opposite the front electrode.

(a) Conductive Particles

According to an embodiment, the conductive particles may include a conductive organic material, a conductive inorganic material, or a mixture thereof.

In an embodiment, the conductive particles are inorganic particles, preferably metal particles. Examples of the conductive particles include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO). The metals may be used alone or in an alloy of two or more kinds thereof. The conductive particles may be used alone or in a mixture of two or more kinds thereof.

In an embodiment, the conductive particles include silver (Ag) particles. In another embodiment the conductive particles include silver (Ag) particles and further include one or more of nickel (Ni), cobalt (Co), iron (Fe), zinc (Zn), and copper (Cu) particles. In another embodiment, the conductive particles include silver (Ag) and aluminum particles.

The conductive particles may have a spherical, a flake shape, an amorphous shape, or a combination thereof. In an embodiment, the conductive particles having a spherical shape may be prepared to improve a filling ratio and UV transmittance, e.g., during a lithographic electrode pattern forming process.

The conductive particle may have an average particle diameter (D50) of about 0.1 to about 10 μm, preferably about 0.2 to about 7 μm, more preferably about 0.5 to about 5 μm, and still more preferably about 1 to about 3 μm.

The conductive particles may be added in an amount of about 60 to about 90 wt % with respect to a total weight of the paste, which may minimize discharge voltage, prevent a short circuit of the electrode, and allow the paste to be easily formed. The conductive particles are preferably added in an amount of about 70 to about 85 wt %, and more preferably in an amount of about 75 to about 82 wt %.

(b) Glass Frit

The glass frit may enhance adhesion between conductive particles and a substrate in a firing process. The glass frit may soften in sintering, thereby lowering a firing temperature.

In an embodiment, the glass frit may be a lead-free glass frit. Here, the lead-free glass frit means a glass frit which contains essentially no lead, e.g., contains less than about 0.005 wt % of lead.

In an embodiment, the glass frit may be a bismuth (Bi)-based glass frit. The bismuth-based glass frit may contain bismuth oxide ($Bi_2O_3$). The bismuth-based glass frit may include bismuth oxide as a main ingredient and further include one or more of barium carbonate ($BaCO_3$), boron oxide ($B_2O_3$), zinc oxide (ZnO), and the like.

Examples of the lead-free glass frit may include, but are not limited to, zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), and bismuth oxide-zinc oxide-boron oxide-silicon oxide-aluminum oxide ($Bi_2O_3$—$ZnO$—$B_2O_3$—$SiO_2$—$Al_2O_3$) glass frit, which may be used alone or in a mixture of two or more kinds thereof.

In an embodiment, the glass frit may have a softening point of about 300 to about 600° C., and preferably about 400 to about 550° C.

The glass frit may have an average particle diameter (D50) of about 0.1 to about 5 μm, which may help in curing of a deep part through UV irradiation and prevent generation of pinholes during a lithographic developing process when forming electrodes.

The glass fit may be added in an amount of about 0.5 to about 20 wt % with respect to a total weight of the paste, which may provide good adhesion between the conductive particles and the substrate is good, and assist in carrying out the firing process. The glass frit may be added preferably in an amount of about 1 to about 10 wt %, and more preferably about 1 to about 5 wt %. In an embodiment, the glass frit may be added in an amount of about 1 to about 3 wt %.

(c) Organic Vehicle

The organic vehicle may be an organic binder that provides liquid properties to the paste. In an embodiment, the organic vehicle (c) may be formed of an organic binder and a solvent. In an embodiment, the organic vehicle (c) may include about 5 to about 40 wt % of the organic binder and about 60 to about 95 wt % of the solvent.

As the organic binder, acrylic polymers obtained by copolymerization of acrylic monomers with a hydrophilic group, such as a carboxyl group, may be used. Furthermore, cellulose polymers, such as ethyl cellulose, hydroxyethyl cellulose, hydroxypropyl cellulose, and hydroxyethyl hydroxypropyl cellulose, may be used. The polymers may be used alone or in a mixture of two or more kinds thereof.

The solvent may be an organic solvent having a boiling point of, e.g., 120° C. or more. Examples of the solvent include methyl cellosolve, ethyl cellosolve, butyl cellosolve, aliphatic alcohol, butyl carbitol acetate (BCA), α-terpineol, β-terpineol, dihydro-terpineol, ethylene glycol, ethylene glycol mono butyl ether, butyl cellosolve acetate, and texanol. These materials may be used alone or in a mixture of two or more kinds thereof.

The organic vehicle may be added in an amount of about 1 to about 30 wt % with respect to a total weight of the paste, preferably about 1 to about 25 wt %, and more preferably about 5 to about 20 wt %, to provide good adhesion and contact resistance.

(d) Lead Oxide (PbO)

An embodiment includes lead oxide (PbO) powder. The lead oxide powder may improve contact resistance of the electrode and efficiency of the solar cell.

The lead oxide (PbO) may have an average particle diameter (D50) of about 0.1 to about 25 μm, and more advantageously about 1.5 to about 15 μm. Further, triplumbic tetroxide (lead tetroxide: $Pb_3O_4$) powder may also added along with the lead oxide.

The lead oxide (PbO) may be added in an amount of about 0.05 to about 1.5 wt % with respect to a total weight of the paste, preferably about 0.1 to about 1 wt %, and more preferably about 0.15 to about 0.6 wt %.

(e) Inorganic Additives

The paste for solar cell electrodes may include the lead oxide (PbO) and inorganic additives, e.g., zinc oxide (ZnO) powder, bismuth oxide ($Bi_2O_3$) powder, or a mixture thereof.

The inorganic additive may have an average particle diameter (D50) of about 0.01 to about 30 μm, more preferably about 0.1 to about 15 μm, and still more preferably about 1 to about 10 μm.

In an embodiment, the inorganic additive may be added in an amount of about 1 to about 10 wt % with respect to a total weight of the paste, preferably about 2 to about 7 wt %, and more preferably about 3 to about 5 wt %, to provide good contact resistance.

The paste for solar cell electrodes may further include one or more general additives, e.g., to enhance flow properties, process properties, and/or stability. The additives may include, e.g., a plasticizer, a dispersant, a thixotropic agent, a viscosity stabilizer, an anti-foaming agent, a pigment, a UV stabilizer, an antioxidant, a coupling agent, etc. These additives may be used alone or in a mixture of two or more kinds thereof.

Other embodiments relate to electrodes formed of the paste for solar cell electrodes and a solar cell including the electrodes. FIG. 1 shows a solar cell according to an embodiment.

Referring to FIG. 1, a rear electrode 210 and a front electrode 230 may be formed by, e.g., printing and firing the paste according to an embodiment on a wafer or substrate 100 that includes a p-layer 101 and an n-layer 102, which will serve as an emitter. The solar cell may provide an electric current to a load R when irradiated with light. For example, a preliminary process for preparing the rear electrode 210 may be performed by printing the paste for electrodes on a rear surface of the wafer 100 and drying the printed paste at about 200 to about 400° C. for about 10 to about 60 seconds. Further, a preliminary process for preparing the front electrode 230 may be performed by printing the paste on a front surface of the wafer 100 and drying the printed paste. Then, the front electrode 230 and the rear electrode 210 may be formed by firing the wafer 100 at about 400 to about 900° C. for about 30 to about 50 seconds. The wafer may be formed of polycrystalline silicon. The wafer 100 may include not only a multi-wafer having bent shapes formed by grains on the surface thereof, but also a mono-wafer. In an implementation, the wafer may be a single-layered wafer that is processed to form a P-N junction. In another implementation, two or more wafers may be stacked and bonded.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES

Specifications of ingredients used in the following examples and comparative examples are as follows:

Comparative Example 2

Comparative Example 2 was carried out by the same process as in Example 1, except that a lead glass frit (b') was used and lead oxide was not used.

Comparative Example 3

Comparative Example 3 was carried out by the same process as in Example 1, except that lead oxide was used at 2 wt %.

Each of the pastes prepared in Examples 1 to 4 and Comparative Examples 1 and 2 was applied to a rear surface and a front surface of a 5-inch multi-wafer and dried at 300° C. for about 20 to about 40 seconds, thereby completing a preliminary process for a rear electrode 210 and a front electrode 230. Then, the wafer was fired at a peak temperature of 755 to 800° C. for 2 to 5 seconds to form the front electrode 230 and the rear electrode 210. Next, the electrodes 210 and 230 were measured in resistance (series resistance, mΩ) and induced photoelectric efficiency by a tester (CT801, Pasan SA). The results are shown in Table 1.

TABLE 1

|  | Example 1 | Example 2 | Example 3 | Example 4 | Comparative Example 1 | Comparative Example 2 | Comparative Example 3 |
|---|---|---|---|---|---|---|---|
| (a) | 79 | 79 | 79 | 79 | 79 | 79 | 79 |
| (b) | 1.12 | 1.12 | 1.12 | 1.12 | 1.12 | — | 1.12 |
| (b') | — | — | — | — | — | 1.32 | — |
| (c) | 16.16 | 15.86 | 15.66 | 15.36 | 16.36 | 16.16 | 17.96 |
| (d) | 0.2 | 0.5 | 0.7 | 1.0 | — | — | 2 |
| (e) | 3.52 | 3.52 | 3.52 | 3.52 | 3.52 | 3.52 | 3.52 |
| Rs (mΩ) | 9.8 | 9.9 | 11.4 | 11.7 | 17.7 | 13.1 | 16.8 |
| Efficiency (%) | 15.19 | 14.85 | 13.75 | 13.66 | 13.83 | 13.67 | 12.64 |

Unit: wt %

(a) Conductive particles: 4-11F (Ag powder, Dowa Holding Co., Ltd.)

(b) Glass frit: lead-free glass frit, 55C-2 (Bi-containing glass, PDE Co., Ltd.)

(b') Glass frit: lead glass frit containing lead oxide, 55C-2 (PDE Co., Ltd.)

(c) Organic vehicle: STD20 (10 wt % of a solid cellulose polymer, 27 wt % BCA, and 63 wt % terpineol, Dow Chemical Co., Ltd.)

(d) Lead oxide (PbO): powder having an average particle diameter (D50) of 10 μm (PDE Co., Ltd.)

(e) Inorganic additives: zinc oxide (ZnO) powder having an average particle diameter (D50) of 2 μm (Kanto Chemical Co., Ltd.)

Examples 1 to 4

The aforementioned ingredients were added at a ratio given in Table 1 and mixed by a C-mixer for 100 seconds, followed by milling by a 3-roll mill, thereby preparing pastes for solar cell electrodes. In Examples 1 to 4, the conductive particles, the glass frit, and the inorganic additive were fixed in amount, and the content of PbO was changed.

Comparative Example 1

Comparative Example 1 was carried out by the same process as in Example 1, except for use of lead oxide, which was not included.

As shown in Table 1, Examples 1 to 4, in which lead oxide was added separately, exhibited good efficiency and improvement in contact resistance, as compared with Comparative examples 1 and 2. In the Examples, a small amount of PbO was added. Thus, environmental problems associated with lead may be substantially eliminated. Further, when PbO is present at 1.5 wt % or less with respect to the total weight of the paste, enhancement in properties may be provided. In particular, when PbO is in the range of 0.2 to 0.5 wt %, remarkable improvement in contact resistance and efficiency may be realized.

Electrodes of a solar cell may be formed on a wafer by applying, patterning, and firing a paste for an electrode. The paste may be used for the electrode of the solar cell, particularly, for a front electrode facing an incident direction of sunlight. Solutions based on lead-free glass frit powder such as Bi-based glass fits may be attractive in consideration of environmental security. However, a paste for an electrode that is based on the lead-free glass frit powder may have relatively weak contact resistance between the electrode and a semiconductor substrate.

In contrast, as described above, an embodiment is directed to a paste for solar cell electrodes that includes conductive particles, a glass frit, an organic vehicle, and lead oxide. Embodiments are also directed to electrodes and solar cells using the same. The paste for solar cell electrodes may improve contact resistance and photoelectric efficiency in electrodes and solar cells using the same.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A paste for solar cell electrodes, the paste comprising:
   conductive particles, wherein said conductive particles consist essentially of at least one of silver, gold, palladium, platinum, copper, chromium, cobalt, aluminum, tin, lead, iron, iridium, osmium, rhodium, tungsten, molybdenum, nickel, and indium tin oxide;
   a lead-free glass frit;
   an organic vehicle; and
   lead oxide particles, said lead oxide particles being present in an amount of about 0.05 to about 1.5 wt % with respect to a total weight of the paste.

2. The paste for solar cell electrodes as claimed in claim 1, wherein said conductive particles consist essentially of silver.

3. The paste for solar cell electrodes as claimed in claim 1, wherein the conductive particles consist essentially of copper.

4. The paste for solar cell electrodes as claimed in claim 1, wherein said lead-free glass frit is a bismuth-based glass frit.

5. The paste for solar cell electrodes as claimed in claim 1, wherein said lead oxide particles are present in an amount of about 0.1 to about 1 wt % with respect to the total weight of the paste.

6. The paste for solar cell electrodes as claimed in claim 1, wherein said lead oxide particles have an average particle diameter (D50) of about 0.1 to about 25 μm.

7. The paste for solar cell electrodes as claimed in claim 1, wherein said paste includes:
   about 60 to about 90 wt % of the conductive particles,
   about 0.5 to about 20 wt % of the lead-free glass fit,
   about 1 to about 30 wt % of the organic vehicle, and
   about 0.05 to about 1.5 wt % of the lead oxide particles.

8. The paste for solar cell electrodes as claimed in claim 7, further comprising zinc oxide, bismuth oxide, or a mixture thereof, in an amount of about 1 to about 10 wt %.

9. The paste for solar cell electrodes as claimed in claim 1, wherein said organic vehicle includes an organic binder and a solvent.

10. The paste for solar cell electrodes as claimed in claim 9, wherein said organic vehicle includes about 5 to about 40 wt % of the organic binder and about 60 to about 95 wt % of the solvent.

11. A solar cell electrode formed by firing the paste as claimed in claim 1.

12. A solar cell comprising the electrode as claimed in claim 11.

* * * * *